United States Patent
Morikawa

(10) Patent No.: US 11,757,453 B2
(45) Date of Patent: Sep. 12, 2023

(54) MULTI-BIT GRAY CODE GENERATION CIRCUIT

(71) Applicant: Sharp Semiconductor Innovation Corporation, Tenri (JP)

(72) Inventor: Yoshinao Morikawa, Fukuyama (JP)

(73) Assignee: Sharp Semiconductor Innovation Corporation, Tenri (JP)

( * ) Notice: Subject to any disclaimer, the term of this patent is extended or adjusted under 35 U.S.C. 154(b) by 0 days.

(21) Appl. No.: 17/526,541

(22) Filed: Nov. 15, 2021

(65) Prior Publication Data

US 2022/0166433 A1 May 26, 2022

(30) Foreign Application Priority Data

Nov. 25, 2020 (JP) ................. 2020-195431

(51) Int. Cl.
*H03K 23/00* (2006.01)
*H03K 23/40* (2006.01)

(52) U.S. Cl.
CPC ........... *H03K 23/005* (2013.01); *H03K 23/40* (2013.01)

(58) Field of Classification Search
CPC ........ H03K 23/005; H03K 23/40; H03M 7/16
See application file for complete search history.

(56) References Cited

U.S. PATENT DOCUMENTS

| | | | | |
|---|---|---|---|---|
| 4,618,849 A * | 10/1986 | Bruestle | ............... | H03K 23/005 377/44 |
| 5,020,082 A * | 5/1991 | Takeda | ................. | H03K 23/588 377/110 |
| 5,097,491 A * | 3/1992 | Hall | ..................... | H03K 23/005 377/106 |
| 5,428,654 A * | 6/1995 | Baqai | ..................... | H03K 23/56 377/45 |
| 9,806,721 B2 * | 10/2017 | Kim | ....................... | H03K 23/58 |
| 10,187,082 B1 * | 1/2019 | Tee | ....................... | H03K 23/005 |
| 2015/0207511 A1 * | 7/2015 | Dahan | ................. | H03K 23/542 377/34 |
| 2021/0160450 A1 * | 5/2021 | Han | ..................... | H03K 23/005 |

FOREIGN PATENT DOCUMENTS

JP     H06-053818 A     2/1994

* cited by examiner

*Primary Examiner* — Tuan T Lam
(74) *Attorney, Agent, or Firm* — ScienBiziP, P.C.

(57) ABSTRACT

A multi-bit gray code generation circuit includes: a zeroth bit gray code generation circuit configured to generate a gray code corresponding to a bit 0 of a multi-bit gray code; and a plurality of gray code generation circuits each configured to generate a gray code corresponding to each bit higher than the bit 0 of the multi-bit gray code. Each of the plurality of gray code generation circuits is constituted by a plurality of flip-flop circuits. An output of a flip-flop circuit in the previous stage is input to a flip-flop circuit of the next stage. An output of a flip-flop circuit of the final stage is inverted and held by a flip-flop circuit of the first stage. An output of one of the plurality of flip-flop circuits is output as a gray code corresponding to each bit.

9 Claims, 19 Drawing Sheets

MULTI-BIT GRAY CODE GENERATION CIRCUIT

CROSS-REFERENCE TO RELATED APPLICATION

The present application claims priority from Japanese Application JP2020-195431, the content of which is hereby incorporated by reference into this application.

BACKGROUND OF THE INVENTION

1. Field of the Invention

The present disclosure relates to a multi-bit gray code generation circuit configured to generate a multi-bit gray code to output the multi-bit gray code.

2. Description of the Related Art

In the related art, a variety of technologies for generating a multi-bit gray code have been developed. As a related technology, there is a disclosure disclosed in JP 06-053818 A.

JP 06-053818A relates to a multi-bit gray code counter configured to count pulse signals and output a gray code corresponding to the count value. The multi-bit gray code counter includes an N-bit gray code up/down counter having an up down function and an M-bit gray code counter.

SUMMARY OF THE INVENTION

In the multi-bit gray code counter disclosed in the above-described JP 06-053818 A, a number of logic circuits other than flip-flop (hereinafter abbreviated as FF) circuits are connected between the FF circuits constituting the gray code counter. A drive frequency of a clock signal input to the FF circuits is determined by a delay time of an FF circuit in the previous stage, a delay time of a logic circuit, and a set up time of an FF circuit of the next stage.

In other words, in a case where there are a number of logic circuits between the FF circuits, the delay time increases, so that the drive frequency of the clock signal input to the FF circuits cannot be increased, and the frequency of the gray code output from the gray code counter cannot be increased either.

An aspect of the present disclosure is directed to achieving a multi-bit gray code generation circuit capable of outputting a gray code at a high frequency.

In order to solve the above problem, a multi-bit gray code generation circuit according to an aspect of the present disclosure includes: a zeroth bit gray code generation circuit configured to generate a gray code corresponding to a bit 0 of a multi-bit gray code; and a plurality of gray code generation circuits each configured to generate a gray code corresponding to each bit higher than the bit 0 of the multi-bit gray code, wherein each of the plurality of gray code generation circuits is constituted by a plurality of flip-flop circuits, an output of a flip-flop circuit in the previous stage is input to a flip-flop circuit of the next stage, an output of a flip-flop circuit of the final stage is inverted and held by a flip-flop circuit of the first stage, and an output of one of the plurality of flip-flop circuits is output as a gray code corresponding to each bit.

According to an aspect of the present disclosure, a multi-bit gray code generation circuit capable of outputting a gray code at a high frequency can be provided.

DETAILED DESCRIPTION OF THE INVENTION

First Embodiment

An embodiment of the disclosure will be described in detail below. Note that for the sake of convenience of description, identical members are given the same reference signs, and the names and functions thereof are the same. Thus, detailed descriptions will not be repeated for the components.

Configuration and Action of Gray Code Generation Circuit 100

Figure 1:
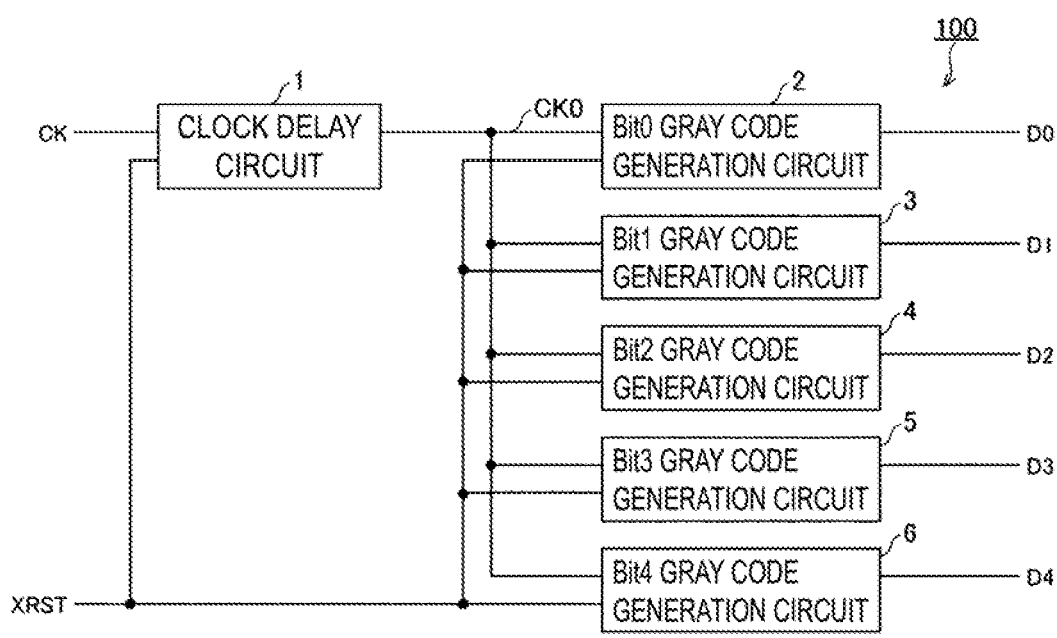
FIG. 1 is a block diagram illustrating a schematic configuration of a multi-bit gray code generation circuit according to a first embodiment of the present disclosure.

FIG. 1 is a block diagram illustrating a schematic configuration of a multi-bit gray code generation circuit 100 according to a first embodiment of the present disclosure. The gray code generation circuit 100 includes a clock delay circuit 1, a Bit0 gray code generation circuit (also referred to as a zeroth gray code generation circuit) 2, a Bit1 gray code generation circuit (also referred to as a first gray code generation circuit) 3, a Bit2 gray code generation circuit (also referred to as a second gray code generation circuit) 4, a Bit3 gray code generation circuit (also referred to as a third gray code generation circuit) 5, and a Bit4 gray code generation circuit (also referred to as a fourth gray code generation circuit) 6.

The clock delay circuit 1 starts outputting a clock signal CK0 several clocks after a reset signal XRST turns from a low level (hereinafter, abbreviated as "0") to a high level (hereinafter, abbreviated as "1").

Each of the Bit0 gray code generation circuit 2, the Bit1 gray code generation circuit 3, the Bit2 gray code generation circuit 4, the Bit3 gray code generation circuit 5, and the Bit4 gray code generation circuit 6 outputs a gray code of a corresponding bit in synchronization with the clock signal CK0 output from the clock delay circuit 1. The details of the gray code generation circuits 2 to 6 corresponding to the respective bits will be described later.

Figure 2:
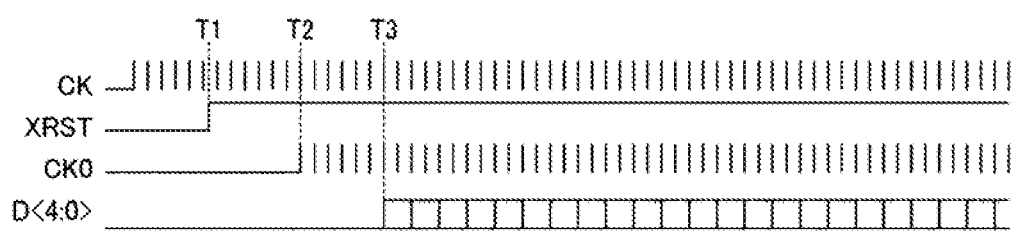
FIG. 2 is a timing chart for describing a schematic action of the multi-bit gray code generation circuit according to the first embodiment of the present disclosure.

FIG. 2 is a timing chart for describing a schematic action of the multi-bit gray code generation circuit 100 according to the first embodiment of the present disclosure. At timing T1, the reset signal XRST turns to "1". At a T2 several clocks after the timing T1, the clock delay circuit 1 starts outputting the clock signal CK0. Then, at a T3 several clocks after the T2, the gray code generation circuits 2 to 6 corresponding to the respective bits start outputting the gray code D<4:0>.

Configuration and Action of Clock Delay Circuit 1

Figure 3:
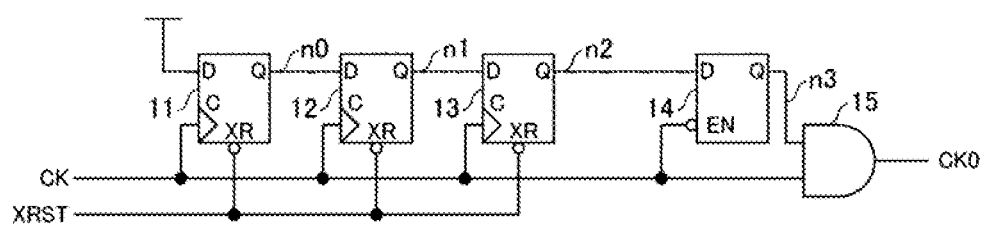
FIG. 3 is a diagram illustrating a circuit configuration of a clock delay circuit.

FIG. 3 is a diagram illustrating a circuit configuration of a clock delay circuit 1. The clock delay circuit 1 includes FF circuits 11 to 13, a latch circuit 14, and an AND circuit 15. The same clock signal CK is connected to the FF circuits 11 to 13 and the latch circuit 14. The same reset signal XRST is connected to the FF circuits 11 to 13.

The FF circuits 11 to 13 are reset when the XRST signal is "0", and each holds a value input to a corresponding input terminal D at the rise of the CK signal to output the value to a corresponding output terminal Q when the XRST signal is "1".

Note that the FF circuits 11 to 13 act at the rise of the clock signal, but may also act at the decay of the clock signal. Accordingly, since the FF circuits 11 to 13 may act at either the rise or the decay of the clock signal, this can also be described that the FF circuits 11 to 13 act in synchronization with the clock signal.

The latch circuit 14 holds the value input to the terminal D at the rise of the CK signal to output the value to the terminal Q, and maintains the state while the CK signal is "1". Then, the value input to the terminal D is directly output (passed through) to the terminal Q when the CK signal is "0".

Figure 4:
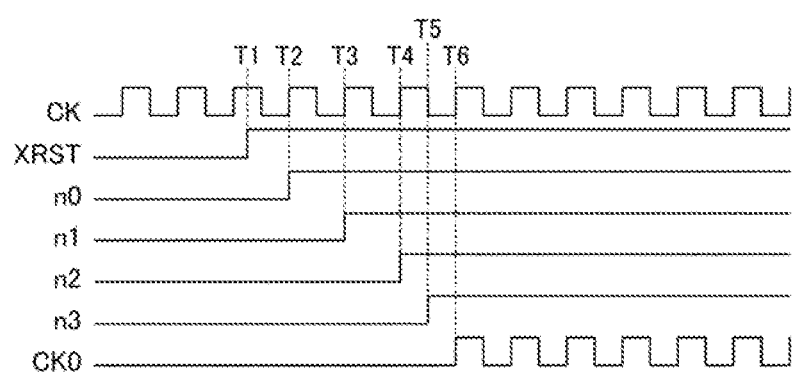
FIG. 4 is a timing chart for describing an action of the clock delay circuit.

FIG. 4 is a timing chart for describing an action of the clock delay circuit 1. At timing T1, the reset signal XRST turns to "1". At a T2, an output signal n0 of the FF circuit 11 changes from "0" to "1". At a T3, an output signal n1 of the FF circuit 12 changes from "0" to "1". At a T4, an output signal n2 of the FF circuit 13 changes from "0" to "1".

At a T5, an output signal n3 of the latch circuit 14 changes from "0" to "1". At a T6, the AND circuit 15 starts outputting the clock signal CK0.

Configuration and Action of Bit0 Gray Code Generation Circuit 2

Figure 5:
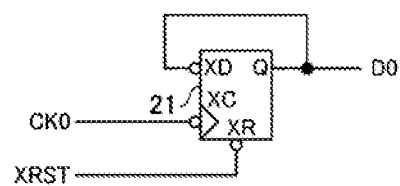
FIG. 5 is a diagram illustrating a circuit configuration of a Bit 0 gray code generation circuit.

FIG. 5 is a diagram illustrating a circuit configuration of a Bit0 gray code generation circuit 2. The Bit0 gray code generation circuit 2 includes an FF circuit 21. The clock signal CK0 and the reset signal XRST output from the clock delay circuit 1 are connected to the FF circuit 21.

The FF circuit 21 is reset when the XRST signal is "0", and holds a value of a terminal XD at the decay of the CK0 signal to output the value to the terminal Q when the XRST signal is "1". Since the XD terminal inverts a value output from the terminal Q to input the resultant value, the XD terminal inverts the value output from the terminal Q to output the resultant value at each decay of the CK0 signal. The value output to the output terminal Q of the FF circuit 21 is a gray code D0 of a bit 0.

Note that the FF circuit 21 acts at the decay of the clock signal, but may alternatively act at the rise of the clock signal. Accordingly, since the FF circuit 21 may act at either the rise or the decay of the clock signal, this can also be described that the FF circuit 21 acts in synchronization with the clock signal.

Figure 6:
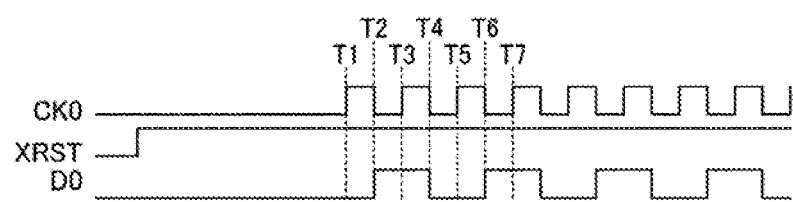
FIG. 6 is a timing chart for describing an action of the Bit 0 gray code generation circuit.

FIG. 6 is a timing chart for describing an action of the Bit0 gray code generation circuit 2. At timing T1, the output of the clock signal CK0 from the clock delay circuit 1 is started, and the output signal D0 of the FF circuit 21 is "0". At a T2, the output signal D0 of the FF circuit 21 changes from "0" to "1" at the decay of the CK0 signal. At a T3, the output signal D0 of the FF circuit 21 is held at "1". At a T4, the output signal D0 of the FF circuit 21 changes from "1" to "0".

At a T5, the output signal D0 of the FF circuit 21 is held at "0". At a T6, the output signal D0 of the FF circuit 21 changes from "0" to "1". At a T7, the output signal D0 of the FF circuit 21 is held at "1". Thereafter, similar actions are performed.

Configuration and Action of Bit1 Gray Code Generation Circuit 3

Figure 7:
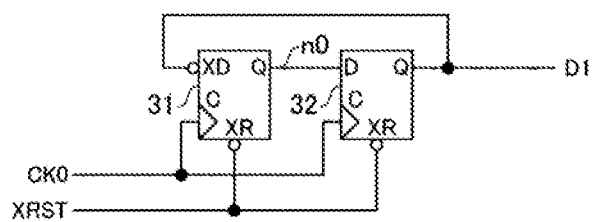
FIG. 7 is a diagram illustrating a circuit configuration of a Bit 1 gray code generation circuit.

FIG. 7 is a diagram illustrating a circuit configuration of a Bit1 gray code generation circuit 3. The Bit1 gray code generation circuit 3 includes FF circuits 31 and 32. The clock signal CK0 and the reset signal XRST output from the clock delay circuit 1 are connected to the FF circuits 31 and 32.

The FF circuit 31 is reset when the XRST signal is "0", and holds a value of the terminal XD at the rise of the CK0 signal to output the value to the terminal Q when the XRST signal is "1". Since the XD terminal inverts a value output from the output terminal Q of the FF circuit 32 to input the resultant value, the XD terminal inverts the value output from the output terminal Q of the FF circuit 32 to output the resultant value at each rise of the CK0 signal.

The FF circuit 32 is reset when the XRST signal is "0", and holds a value of the terminal D at the rise of the CK0 signal to output the value to the terminal Q when the XRST signal is "1". The value output to the output terminal Q of the FF circuit 32 is a gray code D1 of a bit 1.

Note that the FF circuits 31 and 32 act at the rise of the clock signal, but may alternatively act at the decay of the clock signal. Accordingly, since the FF circuits 31 and 32 may act at either the rise or the decay of the clock signal, this can also be described that the FF circuits 31 and 32 act in synchronization with the clock signal.

Figure 8:
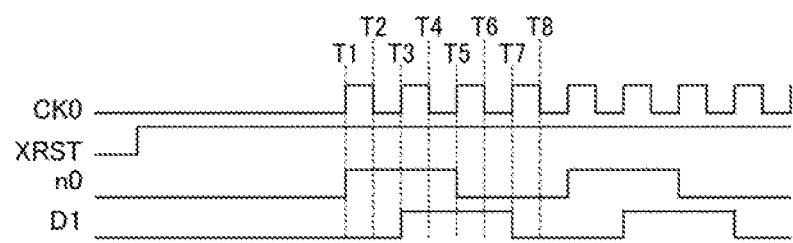
FIG. 8 is a timing chart for describing an action of the Bit 1 gray code generation circuit.

FIG. 8 is a timing chart for describing an action of the Bit1 gray code generation circuit 3. At timing T1, the output of the clock signal CK0 from the clock delay circuit 1 is started, and a value (n0) of an output terminal Q of the FF circuit 31 changes from "0" to "1". At a T2, the output signal n0 of the FF circuit 31 is held at "1". At a T3, a value (D1) of the output terminal Q of the FF circuit 32 changes from "0" to "1". At a T4, the output signals n0 and D1 of the FF circuits 31 and 32 are held at "1".

At a T5, the output signal n0 of the FF circuit 31 changes from "1" to "0". At a T6, the output signal n0 of the FF circuit 31 is held at "0" and the output signal D1 of the FF circuit 32 is held at "1". At a T7, the output signal D1 of the FF circuit 32 changes from "1" to "0". At a T8, the output signals n0 and D1 of the FF circuits 31 and 32 are held at "0". Thereafter, similar actions are performed.

Configuration and Action of Bit2 Gray Code Generation Circuit 4

Figure 9:
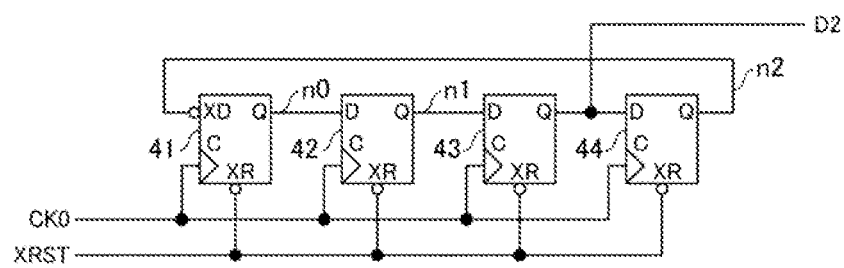
FIG. 9 is a diagram illustrating a circuit configuration of a Bit 2 gray code generation circuit.

FIG. 9 is a diagram illustrating a circuit configuration of a Bit2 gray code generation circuit 4. The Bit2 gray code generation circuit 4 includes FF circuits 41 to 44. The clock signal CK0 and the reset signal XRST output from the clock delay circuit 1 are connected to the FF circuits 41 to 44.

The FF circuit 41 is reset when the XRST signal is "0", and holds a value of the terminal XD at the rise of the CK0 signal to output the value to the terminal Q when the XRST signal is "1". Since the XD terminal inverts a value output from the output terminal Q of the FF circuit 44 to input the resultant value, the XD terminal inverts the value output from the output terminal Q of the FF circuit 44 to output the resultant value at each rise of the CK0 signal.

The FF circuits 42 to 44 are reset when the XRST signal is "0", and each holds a value of the corresponding terminal D at the rise of the CK0 signal to output the value to the corresponding terminal Q when the XRST signal is "1". The value output to the output terminal Q of the FF circuit 43 is a gray code D2 of a bit 2.

Note that the FF circuits 41 to 44 act at the rise of the clock signal, but may alternatively act at the decay of the clock signal. Accordingly, since the FF circuits 41 to 44 may act at either the rise or the decay of the clock signal, this can also be described that the FF circuits 41 to 44 act in synchronization with the clock signal.

Figure 10:
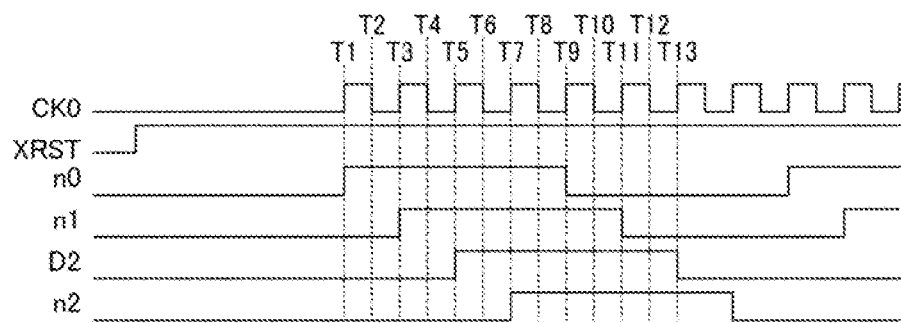
FIG. 10 is a timing chart for describing an action of the Bit 2 gray code generation circuit.

FIG. 10 is a timing chart for describing an action of the Bit2 gray code generation circuit 4. At timing T1, the output of the clock signal CK0 from the clock delay circuit 1 is started, and a value (n0) of an output terminal Q of the FF circuit 41 changes from "0" to "1". At a T2, the output signal n0 of the FF circuit 41 is held at "1". At a T3, a value (n1) of the output terminal Q of the FF circuit 42 changes from "0" to "1". At a T4, the output signals n0 and n1 of the FF circuits 41 and 42 are held at "1".

At a T5, an output signal D2 of the FF circuit 43 changes from "0" to "1". At a T6, the output signals n0, n1, and D2 of the FF circuits 41 to 43 are held at "1". At a T7, an output signal n2 of the FF circuit 44 changes from "0" to "1". At a T8, the output signals n0, n1, D2, and n2 of the FF circuits 41 to 44 are held at "1".

At a T9, the output signal n0 of the FF circuit 41 changes from "1" to "0". At a T10, the FF circuits 41 to 44 hold the same value. At a T1*l*, the output signal n1 of the FF circuit 42 changes from "1" to "0". At a T12, the FF circuits 41 to 44 hold the same value. At a T13, the output signal D2 of the FF circuit 43 changes from "1" to "0". Thereafter, similar actions are performed.

Configuration and Action of Bit3 Gray Code Generation Circuit 5

Figure 11:
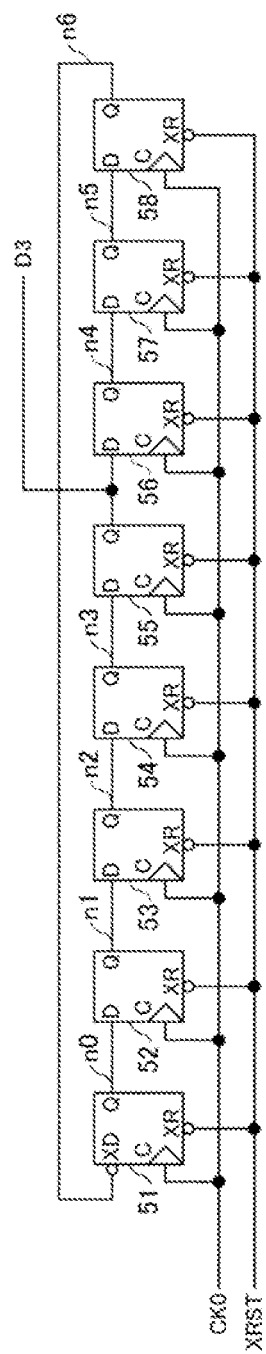
FIG. 11 is a diagram illustrating a circuit configuration of a Bit 3 gray code generation circuit.

FIG. 11 is a diagram illustrating a circuit configuration of a Bit3 gray code generation circuit 5. The Bit3 gray code generation circuit 5 includes FF circuits 51 to 58. The clock signal CK0 and the reset signal XRST output from the clock delay circuit 1 are connected to the FF circuits 51 to 58.

The FF circuit 51 is reset when the XRST signal is "0", and holds a value of the terminal XD at the rise of the CK0 signal to output the value to the terminal Q when the XRST signal is "1". Since the XD terminal inverts a value output from the output terminal Q of the FF circuit 58 to input resultant the value, the XD terminal inverts the value output from the output terminal Q of the FF circuit 58 to output the resultant value at each rise of the CK0 signal.

The FF circuits 52 to 58 are reset when the XRST signal is "0", and each holds a value of the corresponding terminal D at the rise of the CK0 signal to output the value to the corresponding terminal Q when the XRST signal is "1". The value output to the output terminal Q of the FF circuit 55 is a gray code D3 of a bit 3.

Note that the FF circuits 51 to 58 act at the rise of the clock signal, but may alternatively act at the decay of the clock signal. Accordingly, since the FF circuits 51 to 58 may act at either the rise or the decay of the clock signal, this can also be described that the FF circuits 51 to 58 act in synchronization with the clock signal.

Figure 12:
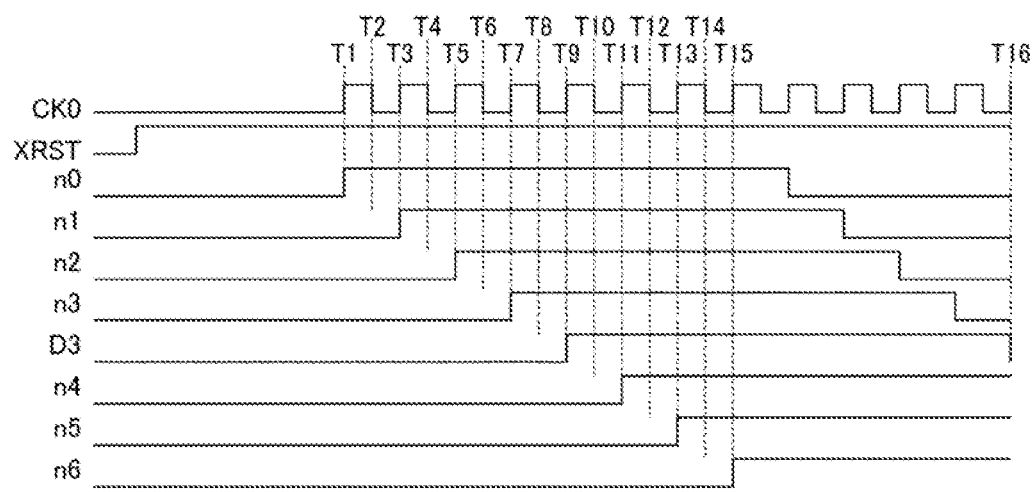
FIG. 12 is a timing chart for describing an action of the Bit 3 gray code generation circuit.

FIG. 12 is a timing chart for describing an action of the Bit3 gray code generation circuit 5. At timing T1, the output of the clock signal CK0 from the clock delay circuit 1 is started, and a value (n0) of an output terminal Q of the FF circuit 51 changes from "0" to "1". At a T2, the output signal n0 of the FF circuit 51 is held at "1". At a T3, a value (n1) of the output terminal Q of the FF circuit 52 changes from "0" to "1". At a T4, the output signals n0 and n1 of the FF circuits 51 and 52 are held at "1".

At a T5, an output signal n2 of the FF circuit 53 changes from "0" to "1". At a T6, the output signals n0, n1, and n2 of the FF circuits 51 to 53 are held at "1". At a T7, an output signal n3 of the FF circuit 54 changes from "0" to "1". At a T8, the output signals n0, n1, n2, and n3 of the FF circuits 51 to 54 are held at "1".

At a T9, an output signal D3 of the FF circuit 55 changes from "0" to "1". At a T10, the FF circuits 51 to 58 hold the same value. At a T11, an output signal n4 of the FF circuit 56 changes from "0" to "1". At a T12, the FF circuits 51 to 58 hold the same value. At a T13, an output signal n5 of the FF circuit 57 changes from "0" to "1".

At a T14, the FF circuits 51 to 58 hold the same value. At a T15, an output signal n6 of the FF circuit 58 changes from "0" to "1". Similar actions are repeated, and at a T16, the output signal D3 of the FF circuit 55 changes from "1" to "0".

Note that the configuration and action of the Bit4 gray code generation circuit 6 will not be described in detail. However, one skilled in the art will be able to easily analogize bits higher than the bit 3, with reference to the configurations and actions of the Bit0 gray code generation circuit 2 to the Bit3 gray code generation circuit 5.

Action of Multi-bit Gray Code Generation Circuit 100

Figure 13:
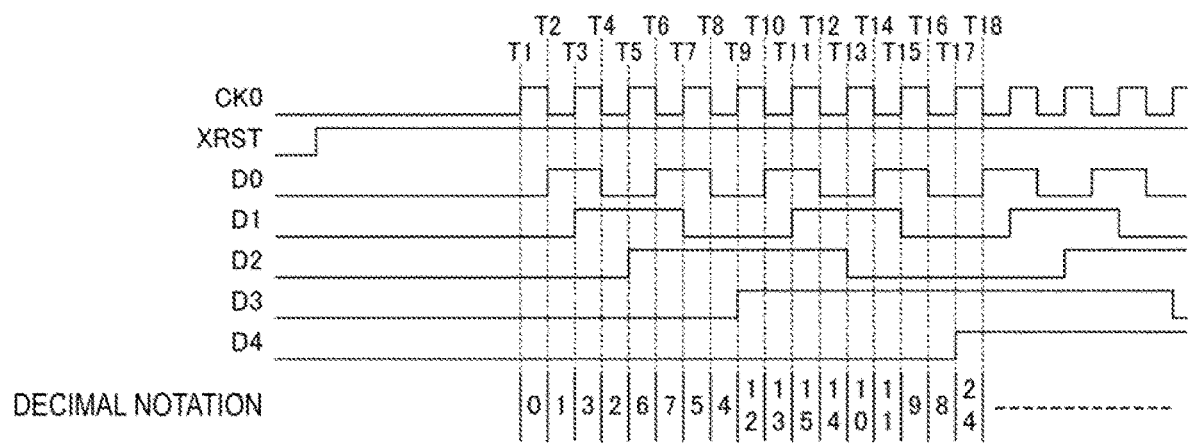
FIG. 13 is a timing chart for describing a detailed action of the multi-bit gray code generation circuit according to the first embodiment of the present disclosure.

FIG. 13 is a timing chart for describing an action of the multi-bit gray code generation circuit 100 in detail. At timing T1, the output of the clock signal CK0 from the clock delay circuit 1 is started, and the output signal D0 of the Bit0 gray code generation circuit 2 is "0". At this time, the multi-bit gray code is "0" in the decimal notation.

At timing T2, the output signal D0 of the Bit0 gray code generation circuit 2 turns to "1", and the output signals of the other gray code generation circuits 3 to 6 do not change. At this time, the multi-bit gray code is "1" in the decimal notation.

At timing T3, the output signal D1 of the Bit1 gray code generation circuit 3 turns to "1", and the output signals of the other gray code generation circuits 2 and 4 to 6 do not change. At this time, the multi-bit gray code is "3" in the decimal notation.

At timing T4, the output signal D0 of the Bit0 gray code generation circuit 2 turns to "0", and the output signals of the other gray code generation circuits 3 to 6 do not change. At this time, the multi-bit gray code is "2" in the decimal notation.

At timing T5, the output signal D2 of the Bit2 gray code generation circuit 4 turns to "1", and the output signals of the other gray code generation circuits 2, 3, 5, and 6 do not change. At this time, the multi-bit gray code is "6" in the decimal notation.

At timing T6, the output signal D0 of the Bit0 gray code generation circuit 2 turns to "1", and the output signals of the other gray code generation circuits 3 to 6 do not change. At this time, the multi-bit gray code is "7" in the decimal notation.

At timing T7, the output signal D1 of the Bit1 gray code generation circuit 3 turns to "0", and the output signals of the other gray code generation circuits 2 and 4 to 6 do not change. At this time, the multi-bit gray code is "5" in the decimal notation.

At timing T8, the output signal D0 of the Bit0 gray code generation circuit 2 turns to "0", and the output signals of the other gray code generation circuits 3 to 6 do not change. At this time, the multi-bit gray code is "4" in the decimal notation.

At timing T9, the output signal D3 of the Bit3 gray code generation circuit 5 turns to "1", and the output signals of the other gray code generation circuits 2 to 4 and 6 do not change. At this time, the multi-bit gray code is "12" in the decimal notation.

At timing T10, the output signal D0 of the Bit0 gray code generation circuit 2 turns to "1", and the output signals of the other gray code generation circuits 3 to 6 do not change. At this time, the multi-bit gray code is "13" in the decimal notation.

At timing T11, the output signal D1 of the Bit1 gray code generation circuit 3 turns to "1", and the output signals of the other gray code generation circuits 2 and 4 to 6 do not change. At this time, the multi-bit gray code is "15" in the decimal notation.

At timing T12, the output signal D0 of the Bit0 gray code generation circuit 2 turns to "0", and the output signals of the other gray code generation circuits 3 to 6 do not change. At this time, the multi-bit gray code is "14" in the decimal notation.

At timing T13, the output signal D2 of the Bit2 gray code generation circuit 4 turns to "0", and the output signals of the other gray code generation circuits 2, 3, 5, and 6 do not change. At this time, the multi-bit gray code is "10" in the decimal notation.

At timing T14, the output signal D0 of the Bit0 gray code generation circuit 2 turns to "1", and the output signals of the other gray code generation circuits 3 to 6 do not change. At this time, the multi-bit gray code is "11" in the decimal notation.

At timing T15, the output signal D1 of the Bit1 gray code generation circuit 3 turns to "0", and the output signals of the other gray code generation circuits 2 and 4 to 6 do not change. At this time, the multi-bit gray code is "9" in the decimal notation.

At timing T16, the output signal D0 of the Bit0 gray code generation circuit 2 turns to "0", and the output signals of the other gray code generation circuits 3 to 6 do not change. At this time, the multi-bit gray code is "8" in the decimal notation.

At timing T17, the output signal D4 of the Bit4 gray code generation circuit 6 turns to "1", and the output signals of the other gray code generation circuits 2 to 5 do not change. At this time, the multi-bit gray code is "24" in the decimal notation. Thereafter, similar actions are performed.

As described above, in the multi-bit gray code generation circuit 100 according to the present embodiment, the circuit configuration of the Bit1 gray code generation circuit 3 to the Bit3 gray code generation circuit 5 has the following configuration. In other words, the configuration is such that a plurality of FF circuits are connected to each other in a so-called loop shape, in which an output of an FF circuit in the previous stage is input to an FF circuit in the next stage, and an output of an FF circuit in the final stage is inverted to be held by an FF circuit in the first stage. An output of one of the plurality of FF circuits is a gray code corresponding to each bit.

By such a configuration, there is no logic circuit between the FF circuits, and the delay time decreases, so that the drive frequency of the clock signal input to the FF circuits can be increased. Thus, the frequency of the gray code output from the multi-bit gray code generation circuit 100 can also be increased.

Furthermore, since the Bit0 gray code generation circuit 2 and the other gray code generation circuits 3 to 6 act with being shifted from each other by half the cycle of the clock signal, the gray code generating circuit 2 and the gray code generating circuits 3 to 6 can act in half the cycle of the clock signal as a whole. Thus, the frequency of the gray code output from the multi-bit gray code generation circuit 100 can be further increased.

Since the clock delay circuit 1 starts outputting the clock signal after a predetermined number of clocks from reset releasing by the reset signal XRST, the output of the multi-bit gray code can be started at any timing.

Second Embodiment

Another embodiment of the disclosure will be described below. Note that, for convenience of explanation, components having the same functions as those described above in the first embodiment will be denoted by the same reference signs, and detailed descriptions of those components will be omitted.

Configuration and Action of Gray Code Generation Circuit 100a

Figure 14:
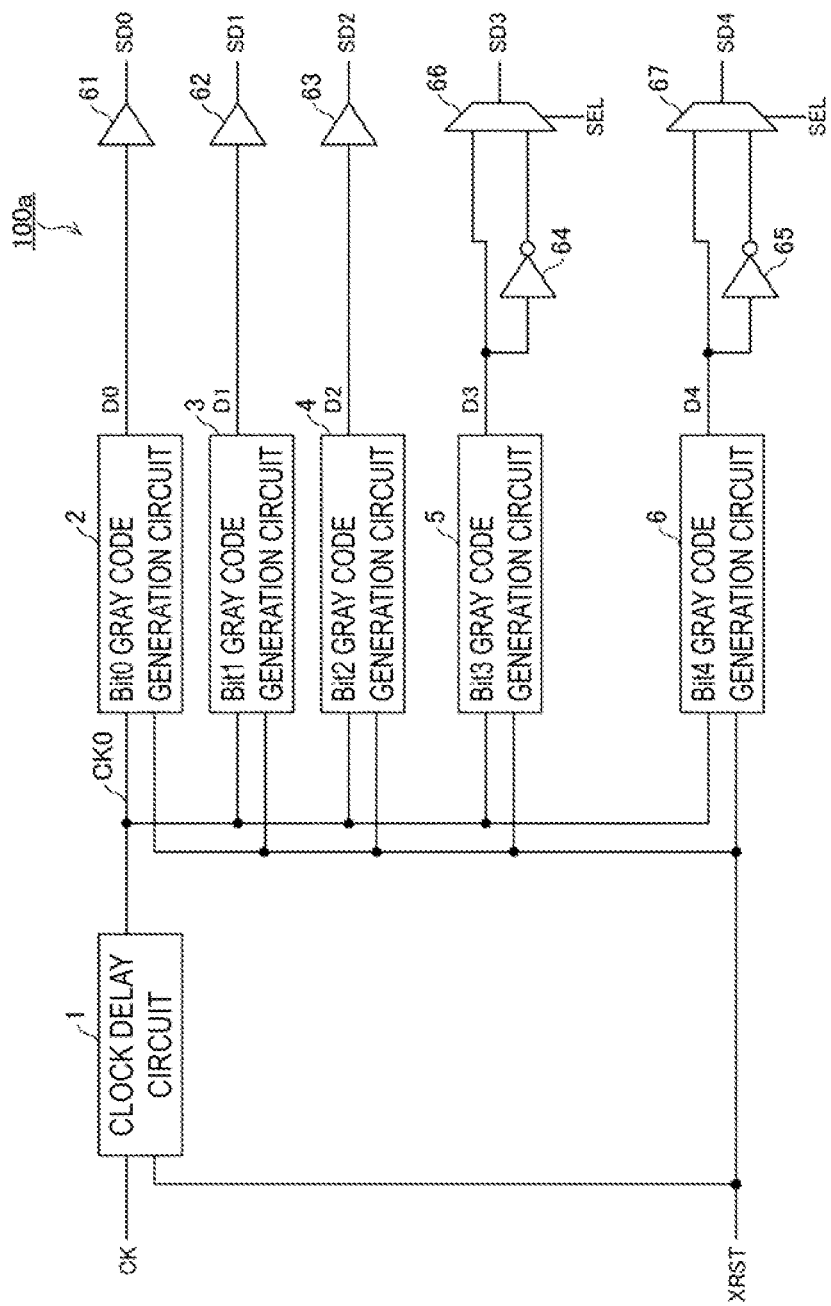
FIG. 14 is a block diagram illustrating a schematic configuration of a multi-bit gray code generation circuit according to a second embodiment of the present disclosure.

FIG. 14 is a block diagram illustrating a schematic configuration of a multi-bit gray code generation circuit 100a according to a second embodiment of the present disclosure. Compared to the multi-bit gray code generation circuit 100 according to the first embodiment illustrated in FIG. 1, the only difference is a point in which buffers 61 to 63, inverters (inversion circuits) 64 and 65, and selectors (selection circuits) 66 and 67 are added.

The buffers 61 to 63 output the values of the output signals D0 to D2 from the Bit0 gray code generation circuit 2 to the Bit2 gray code generation circuit 4 as SD0 to SD2 without change. The buffers 61 to 63 may not be particularly provided.

The inverter 64 inverts a value of the output signal D3 from the Bit3 gray code generation circuit 5 to output the resultant value. The selector 66 selects the value of the output signal D3 from the Bit3 gray code generation circuit 5 to output the value as an SD3 when the SEL signal is "0". The selector 66 selects a value obtained by inverting the D3 by the inverter 64 to output the resultant value as the SD3 when the SEL signal is "1".

The inverter 65 inverts a value of the output signal D4 from the Bit4 gray code generation circuit 6 to output the resultant value. The selector 67 selects the value of the output signal D4 from the Bit4 gray code generation circuit 6 to output the value as an SD4 when the SEL signal is "0". The selector 67 selects a value obtained by inverting the D4 by the inverter 65 to output the resultant value as the SD4 when the SEL signal is "1".

Figure 15:
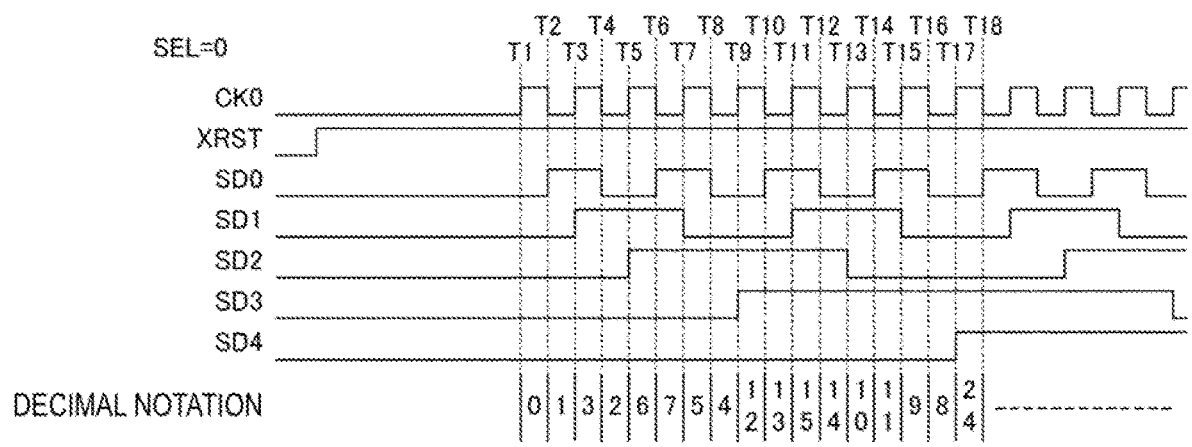
FIG. 15 is a timing chart for describing an action in a case where an SEL signal is "0" in the multi-bit gray code generation circuit according to the second embodiment of the present disclosure.

FIG. 15 is a timing chart for describing an action in a case where the SEL signal is "0" in the multi-bit gray code generation circuit 100a according to the second embodiment of the present disclosure. This timing chart is similar to the timing chart illustrated in FIG. 13. Thus, detailed descriptions will not be repeated.

Figure 16:
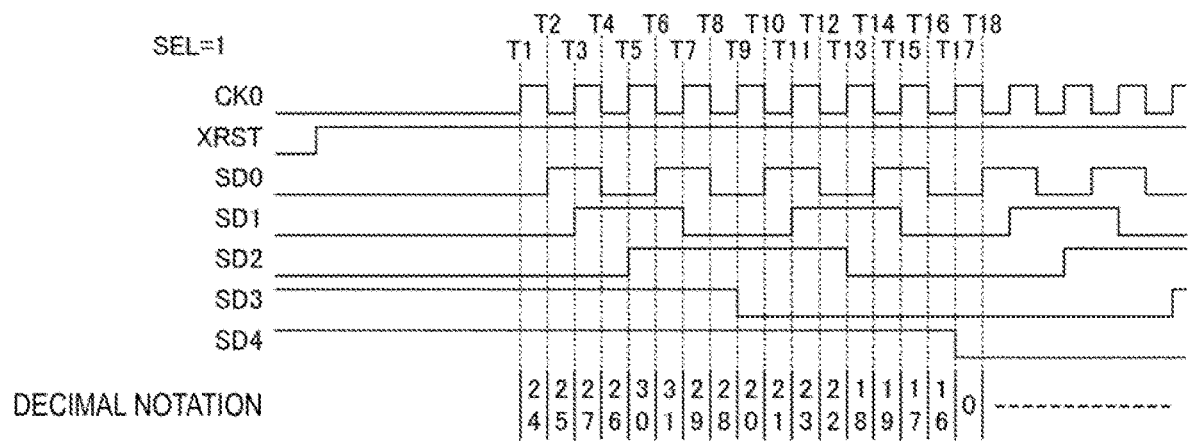
FIG. 16 is a timing chart for describing an action in a case where the SEL signal is "1" in the multi-bit gray code generation circuit according to the second embodiment of the present disclosure.

FIG. 16 is a timing chart for describing an action in a case where the SEL signal is "1" in the multi-bit gray code generation circuit 100a according to the second embodiment of the present disclosure. At timing T1, the output of the clock signal CK0 from the clock delay circuit 1 is started, the output signals D0 to D2 of the Bit0 gray code generation circuit 2 to the Bit2 gray code generation circuit 4 are "0", and the SD0 to SD3 turn to "0". The output signals D3 and D4 of the Bit3 gray code generation circuit 5 and the Bit4 gray code generation circuit 6 are "0", and the SD3 and SD4 turn to "1". At this time, the multi-bit gray code is "24" in the decimal notation.

At timing T2, the output signal D0 of the Bit0 gray code generation circuit 2 turns to "1", and the output signals of the other gray code generation circuits 3 to 6 do not change. At this time, the multi-bit gray code is "25" in the decimal notation.

At timing T3, the output signal D1 of the Bit1 gray code generation circuit 3 turns to "1", and the output signals of the other gray code generation circuits 2 and 4 to 6 do not change. At this time, the multi-bit gray code is "27" in the decimal notation.

At timing T4, the output signal D0 of the Bit0 gray code generation circuit 2 turns to "0", and the output signals of the other gray code generation circuits 3 to 6 do not change. At this time, the multi-bit gray code is "26" in the decimal notation.

At timing T5, the output signal D2 of the Bit2 gray code generation circuit 4 turns to "1", and the output signals of the other gray code generation circuits 2, 3, 5, and 6 do not change. At this time, the multi-bit gray code is "30" in the decimal notation.

At timing T6, the output signal D0 of the Bit0 gray code generation circuit 2 turns to "1", and the output signals of the other gray code generation circuits 3 to 6 do not change. At this time, the multi-bit gray code is "31" in the decimal notation.

At timing T7, the output signal D1 of the Bit1 gray code generation circuit 3 turns to "0", and the output signals of the other gray code generation circuits 2 and 4 to 6 do not change. At this time, the multi-bit gray code is "29" in the decimal notation.

At timing T8, the output signal D0 of the Bit0 gray code generation circuit 2 turns to "0", and the output signals of the other gray code generation circuits 3 to 6 do not change. At this time, the multi-bit gray code is "28" in the decimal notation.

At timing T9, the output signal D3 of the Bit3 gray code generation circuit 5 turns to "1", and the SD3 turns to "0". The output signals of the other gray code generation circuits 2 to 4 and 6 do not change. At this time, the multi-bit gray code is "20" in the decimal notation.

At timing T10, the output signal D0 of the Bit0 gray code generation circuit 2 turns to "1", and the output signals of the other gray code generation circuits 3 to 6 do not change. At this time, the multi-bit gray code is "21" in the decimal notation.

At timing T11, the output signal D1 of the Bit1 gray code generation circuit 3 turns to "1", and the output signals of the other gray code generation circuits 2 and 4 to 6 do not change. At this time, the multi-bit gray code is "23" in the decimal notation.

At timing T12, the output signal D0 of the Bit0 gray code generation circuit 2 turns to "0", and the output signals of the other gray code generation circuits 3 to 6 do not change. At this time, the multi-bit gray code is "22" in the decimal notation.

At timing T13, the output signal D2 of the Bit2 gray code generation circuit 4 turns to "0", and the output signals of the other gray code generation circuits 2, 3, 5, and 6 do not change. At this time, the multi-bit gray code is "18" in the decimal notation.

At timing T14, the output signal D0 of the Bit0 gray code generation circuit 2 turns to "1", and the output signals of the other gray code generation circuits 3 to 6 do not change. At this time, the multi-bit gray code is "19" in the decimal notation.

At timing T15, the output signal D1 of the Bit1 gray code generation circuit 3 turns to "0", and the output signals of the other gray code generation circuits 2 and 4 to 6 do not change. At this time, the multi-bit gray code is "17" in the decimal notation.

At timing T16, the output signal D0 of the Bit0 gray code generation circuit 2 turns to "0", and the output signals of the other gray code generation circuits 3 to 6 do not change. At this time, the multi-bit gray code is "16" in the decimal notation.

At timing T17, the output signal D4 of the Bit4 gray code generation circuit 6 turns to "1", and the SD4 turns to "0". The output signals of the other gray code generation circuits 2 to 5 do not change. At this time, the multi-bit gray code is "0" in the decimal notation. Thereafter, similar actions are performed.

As described above, in the multi-bit gray code generation circuit 100a according to the present embodiment, the selectors 66 and 67 select the values of the output signals D3 and D4 from the Bit3 gray code generation circuit 5 and the Bit4 gray code generation circuit 6 to output the selected values as the SD3 and the SD4 when the SEL signal is "0". The selectors 66 and 67 select values obtained by inverting the D3 and the D4 by the inverters 64 and 65 to output the resultant values, as the SD3 and the SD4, when the SEL signal is "1".

Thus, by changing the SEL signal from "0" to "1", a start code of the gray code can be changed from "0" to "24" in the decimal notation, so that a multi-bit gray code generation circuit having high versatility can be provided.

Third Embodiment

Another embodiment of the disclosure will be described below. Note that, for convenience of explanation, components having the same functions as those described above in the first embodiment will be denoted by the same reference signs, and detailed descriptions of those components will be omitted.

Configuration and Action of Gray Code Generation Circuit 100b

Figure 17:
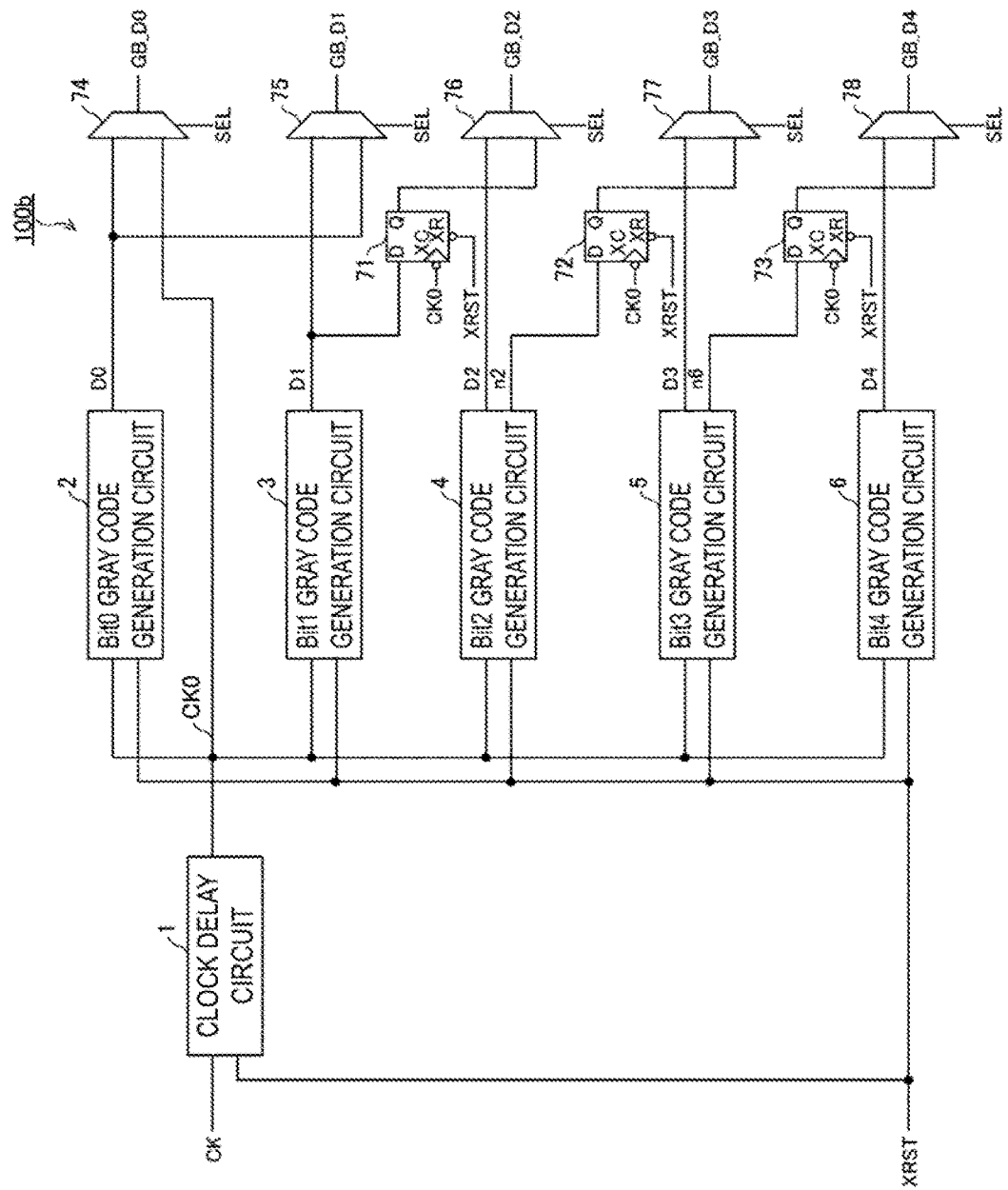
FIG. 17 is a block diagram illustrating a schematic configuration of a multi-bit gray code generation circuit according to a third embodiment of the present disclosure.

FIG. 17 is a block diagram illustrating a schematic configuration of a multi-bit gray code generation circuit 100b according to a third embodiment of the present disclosure. Compared to the multi-bit gray code generation circuit 100 according to the first embodiment illustrated in FIG. 1, the only difference is a point in which FF circuits 71 to 73 and selectors (selection circuits) 74 to 78 are added.

The FF circuits 71 to 73 are reset when the XRST signal is "0", and each holds a value of the corresponding terminal D at the decay of the CK0 signal to output the value to the corresponding terminal Q when the XRST signal is "1".

The selector 74 selects the output signal D0 from the Bit0 gray code generation circuit 2 to output the output signal D0 as a GB_D0 when the SEL signal is "0". The selector 74 selects the clock signal CK0 to output the clock signal CK0 as the GB_D0 when the SEL signal is "1".

The selector 75 selects the output signal D1 from the Bit1 gray code generation circuit 3 to output the output signal D1 as a GB_D1 when the SEL signal is "0". The selector 75 selects the output signal D0 from the Bit0 gray code generation circuit 2 to output the output signal D0 as the GB_D1 when the SEL signal is "1".

The FF circuit 71 holds a value of the output signal D1 from the Bit1 gray code generation circuit 3 at the decay of the CK0 signal to output the value to the selector 76 when the XRST signal is "1". The selector 76 selects the output signal D2 from the Bit2 gray code generation circuit 4 to output the output signal D2 as a GB_D2 when the SEL signal is "0". The selector 76 selects the output signal from the FF circuit 71 to output the output signal as the GB_D2 when the SEL signal is "1".

The FF circuit 72 holds a value of the output signal n2 of the Bit2 gray code generation circuit 4 at the decay of the CK0 signal to output the value to the selector 77 when the XRST signal is "1". The selector 77 selects the output signal D3 from the Bit3 gray code generation circuit 5 to output the output signal D3 as a GB_D3 when the SEL signal is "0". The selector 77 selects the output signal from the FF circuit 72 to output the output signal as the GB_D3 when the SEL signal is "1".

The FF circuit 73 holds a value of the output signal n6 of the Bit3 gray code generation circuit 5 at the decay of the CK0 signal to output the value to the selector 78 when the XRST signal is "1". The selector 78 selects the output signal D4 from the Bit4 gray code generation circuit 6 to output the output signal D4 as a GB_D4 when the SEL signal is "0". The selector 78 selects the output signal from the FF circuit 73 to output the output signal as the GB_D4 when the SEL signal is "1".

Hereinafter, the output signals GB_D0 to GB_D4 of the selectors 74 to 78 are referred to as binary codes.

Figure 18:
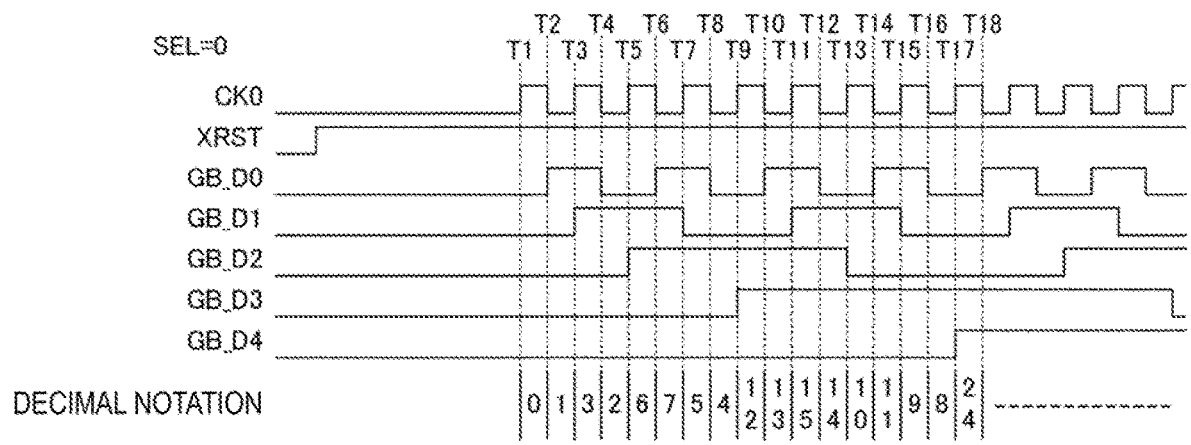
FIG. 18 is a timing chart for describing an action in a case where the SEL signal is "0" in the multi-bit gray code generation circuit according to the third embodiment of the present disclosure.

FIG. 18 is a timing chart for describing an action in a case where the SEL signal is "0" in the multi-bit gray code generation circuit 100b according to the third embodiment of the present disclosure. This timing chart is similar to the timing chart illustrated in FIG. 13. Thus, detailed descriptions will not be repeated.

Figure 19:
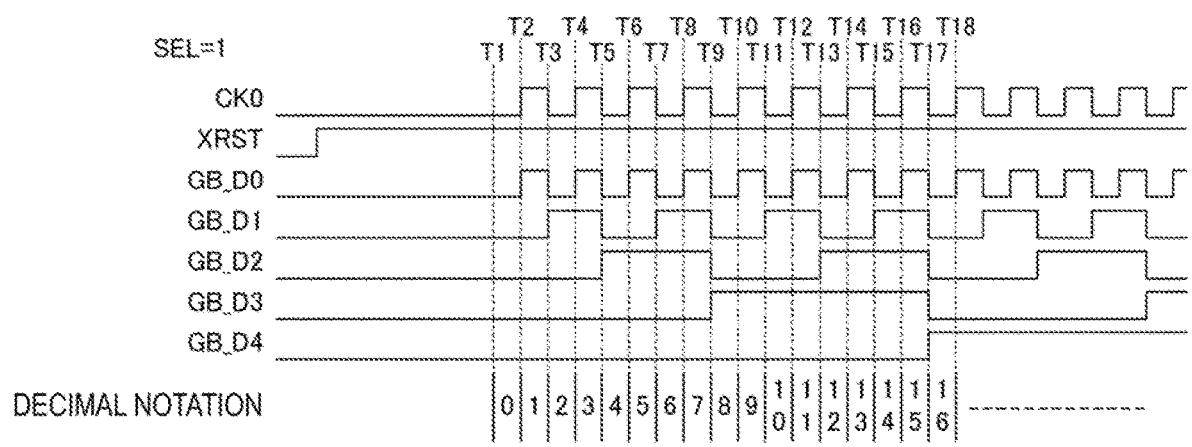
FIG. 19 is a timing chart for describing an action in a case where the SEL signal is "1" in the multi-bit gray code generation circuit according to the third embodiment of the present disclosure.

FIG. 19 is a timing chart for describing an action in a case where the SEL signal is "1" in the multi-bit gray code generation circuit 100b according to the third embodiment of the present disclosure. At timing T1, all of the output signals GB_D0 to GB_D4 of the selectors 74 to 78 turn to "0". At this time, the binary code is "0" in the decimal notation.

At 2, the output of the clock signal CK0 from the clock delay circuit 1 is started, and the selector 74 selects the clock signal CK0 to output the timing T clock signal CK0 as the GB_D0. At this time, the binary code is "1" in the decimal notation. Thereafter, the selector 74 outputs the same timing waveform as that of the clock signal CK0 to the GB_D0.

At timing T3, the output signal D0 of the Bit0 gray code generation circuit 2 turns to "1", and the selector 75 outputs "1" to the GB_D1. At this time, the binary code is "2" in the decimal notation.

At timing T4, the output signal D1 of the Bit1 gray code generation circuit 3 turns to "1", and the output of the output terminal Q of the FF circuit 71 remains "0". At this time, the binary code is "3" in the decimal notation.

At timing T5, the output signal D0 of the Bit0 gray code generation circuit 2 turns to "0", and the selector 75 outputs "0" to the GB_D1. The FF circuit 71 holds the value "1" of the output signal D1 of the Bit1 gray code generation circuit 3 to output the value "1" to the selector 76. The selector 76 selects the value "1" held by the FF circuit 71 to output the value "1" as the GB_D2. At this time, the binary code is "4" in the decimal notation.

At timing T6, the values of the outputs GB_D1 to GB_D4 of the selectors 75 to 78 do not change. At this time, the binary code is "5" in the decimal notation.

At timing T7, the output signal D0 of the Bit0 gray code generation circuit 2 turns to "1", and the selector 75 outputs "1" to the GB_D1. At this time, the binary code is "6" in the decimal notation.

At timing T8, the values of the outputs GB_D1 to GB_D4 of the selectors 75 to 78 do not change. At this time, the binary code is "7" in the decimal notation.

At timing T9, the FF circuit 71 holds the value "0" of the output signal D1 of the Bit1 gray code generation circuit 3 to output the value "0" to the selector 76. The selector 76 selects the value "0" held by the FF circuit 71 to output the value "0" as the GB_D2. The FF circuit 72 holds the value "1" of the output signal n2 of the Bit2 gray code generation circuit 4 to output the value "1" to the selector 77. The selector 77 selects the value "1" held by the FF circuit 72 to output the value "1" as the GB_D3. At this time, the binary code is "8" in the decimal notation.

At timing T10, the values of the outputs GB_D1 to GB_D4 of the selectors 75 to 78 do not change. At this time, the binary code is "9" in the decimal notation.

At timing T11, the output signal D0 of the Bit0 gray code generation circuit 2 turns to "1", and the selector 75 outputs "1" to the GB_D1. At this time, the binary code is "10" in the decimal notation.

At the timing T12, the values of the outputs GB_D1 to GB_D4 of the selectors 75 to 78 do not change. At this time, the binary code is "11" in the decimal notation.

At timing T13, the output signal D0 of the Bit0 gray code generation circuit 2 turns to "0", and the selector 75 outputs "0" to the GB_D1. The FF circuit 71 holds the value "1" of the output signal D1 of the Bit1 gray code generation circuit 3 to output the value "1" to the selector 76. The selector 76 selects the value "1" held by the FF circuit 71 to output the value "1" as the GB_D2. At this time, the binary code is "12" in the decimal notation.

At timing T14, the outputs GB_D1 to GB_D4 of the selectors 75 to 78 do not change. At this time, the binary code is "13" in the decimal notation.

At timing T15, the output signal D0 of the Bit0 gray code generation circuit 2 turns to "1", and the selector 75 outputs "1" to the GB_D1. At this time, the binary code is "14" in the decimal notation.

At timing T16, the values of the outputs GB_D1 to GB_D4 of the selectors 75 to 78 do not change. At this time, the binary code is "15" in the decimal notation.

At timing T17, the FF circuit 71 holds the value "0" of the output signal D1 of the Bit1 gray code generation circuit 3 to output the value "0" to the selector 76. The selector 76 selects the value "0" held by the FF circuit 71 to output the value "0" as the GB_D2. The FF circuit 72 holds the value "0" of the output signal n2 of the Bit2 gray code generation circuit 4 to output the value "0" to the selector 77. The selector 77 selects the value "0" held by the FF circuit 72 to output the value "0" as the GB_D3. The FF circuit 73 holds the value "1" of the output signal n6 of the Bit3 gray code generation circuit 5 to output the value "1" to the selector 78. The selector 78 selects the value "1" held by the FF circuit 73 to output the value "1" as the GB_D4. At this time, the binary code is "16" in the decimal notation.

As described above, according to the multi-bit gray code generation circuit 100b of the present embodiment, the selector 74 is configured to select the clock signal CK0 to output the CK0 when the SEL signal is "1". The selector 75 is configured to select the output signal D0 from the Bit0 gray code generation circuit 2 to output the output signal D0. The selectors 76 to 78 are configured to select the output signals from the FF circuits 71 to 73 to output the output signals. According to the above configurations, the multi-bit gray code generation circuit 100b can convert a 5-bit gray code into a 5-bit binary code.

Supplement

A multi-bit gray code generation circuit according to a first aspect of the present disclosure includes: a zeroth bit gray code generation circuit configured to generate a gray code corresponding to a bit 0 of a multi-bit gray code; and a plurality of gray code generation circuits each configured to generate a gray code corresponding to each bit higher than the bit 0 of the multi-bit gray code, wherein each of the plurality of gray code generation circuits is constituted by a plurality of flip-flop circuits, an output of a flip-flop circuit in the previous stage is input to a flip-flop circuit of the next stage, an output of a flip-flop circuit of the final stage is inverted and held by a flip-flop circuit of the first stage, and an output of one of the plurality of flip-flop circuits is output as a gray code corresponding to each bit.

According to the above-described configuration, there is no logic circuit between the flip-flop circuits, and a delay time decreases, so that a drive frequency of a clock signal input to the flip-flop circuits can be increased. Thus, a frequency of the gray code output from the multi-bit gray code generation circuit can also be increased.

In a multi-bit gray code generation circuit according to a second aspect of the present disclosure, in the above-described first aspect, the zeroth gray code generation circuit and the plurality of gray code generation circuits act with being shifted from each other by half the cycle of the clock signal.

According to the above-described configuration, the frequency of the gray code output from the multi-bit gray code generation circuit can be further increased.

In a multi-bit gray code generation circuit according to a third aspect of the present disclosure, in the above-described first or second aspect, the zeroth gray code generation circuit includes a first flip-flop circuit configured to hold a value obtained by inverting an output in synchronization with the clock signal to output the output as the bit 0 of the gray code.

According to the above-described configuration, the drive frequency of the clock signal input to the flip-flop circuits can be increased.

In a multi-bit gray code generation circuit according to a fourth aspect of the present disclosure, in any one of the above-described first to third aspects, the plurality of gray code generation circuits include a first gray code generation circuit including a second flip-flop circuit configured to hold a value obtained by inverting an input in synchronization with the clock signal to output the value and a third flip-flop circuit configured to hold the value of the output of the second flip-flop circuit in synchronization with the clock signal to output the value to the second flip-flop circuit and to set the output to be a bit 1 of the gray code.

According to the above-described configuration, there is no logic circuit between the flip-flop circuits, and the delay time decreases, so that the drive frequency of the clock signal input to the flip-flop circuits can be increased.

In a multi-bit gray code generation circuit according to a fifth aspect of the present disclosure, in the above-described fourth aspect, the plurality of gray code generation circuits further include a second gray code generation circuit including a fourth flip-flop circuit configured to hold a value obtained by inverting an input in synchronization with the clock signal to output the value, a fifth flip-flop circuit configured to hold a value of an output of the fourth flip-flop circuit in synchronization with the clock signal to output the value, a sixth flip-flop circuit configured to hold a value of an output of the fifth flip-flop circuit in synchronization with the clock signal to output the value and to set the output to be a bit 2 of the gray code, and a seventh flip-flop circuit configured to hold a value of the output of the sixth flip-flop circuit in synchronization with the clock signal to output the value to the fourth flip-flop circuit.

According to the above-described configuration, there is no logic circuit between the flip-flop circuits, and the delay time decreases, so that the drive frequency of the clock signal input to the flip-flop circuits can be increased.

In a multi-bit gray code generation circuit according to a sixth aspect of the present disclosure, in the above-described fifth aspect, the plurality of gray code generation circuits further include a third gray code generation circuit including an eighth flip-flop circuit configured to hold a value obtained by inverting an input in synchronization with the clock signal to output the value, a ninth flip-flop circuit configured to hold a value of an output of the eighth flip-flop circuit in synchronization with the clock signal to output the value, a tenth flip-flop circuit configured to hold a value of an output of the ninth flip-flop circuit in synchronization with the clock signal to output the value, an eleventh flip-flop circuit configured to hold a value of an output of the tenth flip-flop circuit in synchronization with the clock signal to output the value, a twelfth flip-flop circuit configured to hold a value of an output of the eleventh flip-flop circuit in synchronization with the clock signal to output the value and to set the output to be a bit 3 of the gray code, a thirteenth flip-flop circuit configured to hold a value of an output of the twelfth flip-flop circuit in synchronization with the clock signal to output the value, a fourteenth flip-flop circuit configured to hold a value of an output of the thirteenth flip-flop circuit in synchronization with the clock signal to output the value, and a fifteenth flip-flop circuit configured to hold a value of an output of the fourteenth flip-flop circuit in synchronization with the clock signal to output the value to the eighth flip-flop circuit.

According to the above-described configuration, there is no logic circuit between the flip-flop circuits, and the delay time decreases, so that the drive frequency of the clock signal input to the flip-flop circuits can be increased.

In a multi-bit gray code generation circuit according to a seventh aspect of the present disclosure, in the above-described sixth aspect, the multi-bit gray code generation circuit further includes a fourth gray code generation circuit configured to generate a bit 4 of the gray code, a first selection circuit configured to selectively output a value of the output from the third gray code generation circuit and a value obtained by inverting the output from the third gray code generation circuit, and a second selection circuit configured to selectively output a value of the output from the fourth gray code generation circuit and a value obtained by inverting the output from the fourth gray code generation circuit.

According to the above-described configuration, a start code of the gray code can be changed, so that a multi-bit gray code generation circuit having high versatility can be provided.

In a multi-bit gray code generation circuit according to an eighth aspect of the present disclosure, in the above-described sixth aspect, the multi-bit gray code generation circuit further includes a fourth gray code generation circuit configured to generate a bit 4 of the gray code, a sixteenth flip-flop circuit configured to hold a value of an output of the first gray code generation circuit in synchronization with the clock signal to output the value, a seventeenth flip-flop circuit configured to hold a value of an output of the seventh flip-flop circuit of the second gray code generation circuit in synchronization with the clock signal to output the value, an eighteenth flip-flop circuit configured to hold a value of an output of the fifteenth flip-flop circuit of the third gray code generation circuit in synchronization with the clock signal to output the value, a third selection circuit configured to selectively output the output from the zeroth gray code generation circuit and the clock signal, a fourth selection circuit configured to selectively output the output from the first gray code generation circuit and the output from the zeroth gray code generation circuit, a fifth selection circuit configured to selectively output the output from the second gray code generation circuit and the output from the sixteenth flip-flop circuit, a sixth selection circuit configured to selectively output the output from the third gray code generation circuit and the output from the seventeenth flip-flop circuit, and a seventh selection circuit configured to selectively output the output from the fourth gray code generation circuit and the output from the eighteenth flip-flop circuit.

According to the above-described configuration, the multi-bit gray code generation circuit can convert the gray code into a binary code.

In a multi-bit gray code generation circuit according to a ninth aspect of the present disclosure, in any one of the above-described first to eight aspects, the multi-bit gray code generation circuit further includes a clock delay circuit configured to start outputting the clock signal after a predetermined number of clocks from reset releasing.

According to the above-described configuration, the multi-bit gray code generation circuit can start outputting the multi-bit gray code at an arbitrary timing.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A multi-bit gray code generation circuit comprising:
a zeroth bit gray code generation circuit configured to generate a gray code corresponding to a bit 0 of a multi-bit gray code; and
a plurality of gray code generation circuits each configured to generate a gray code corresponding to each bit higher than the bit 0 of the multi-bit gray code,
wherein each of the plurality of gray code generation circuits comprises a plurality of flip-flop circuits independent from a plurality of flip-flop circuits in other gray code generation circuits among the plurality of gray code generation circuits, and includes different number of flip-flop circuits from the other gray code generation circuits,
an output of a flip-flop circuit in a previous stage is input to a flip-flop circuit of a next stage,
an output of a flip-flop circuit of a final stage is inverted and held by a flip-flop circuit of a first stage, and
an output of one of the plurality of flip-flop circuits is output as a gray code corresponding to each bit.

2. The multi-bit gray code generation circuit according to claim 1,
wherein the plurality of gray code generation circuits includes a first gray code generation circuit comprising
a second flip-flop circuit configured to hold a value obtained by inverting an input in synchronization with the clock signal to output the value and
a third flip-flop circuit configured to hold the value of the output of the second flip-flop circuit in synchronization with the clock signal to output the value to the second flip-flop circuit and to set the output to be a bit 1 of the gray code.

3. A multi-bit gray code generation circuit comprising:
a zeroth bit gray code generation circuit configured to generate a gray code corresponding to a bit 0 of a multi-bit gray code; and
a plurality of gray code generation circuits each configured to generate a gray code corresponding to each bit higher than the bit 0 of the multi-bit gray code,
wherein each of the plurality of gray code generation circuits comprises a plurality of flip-flop circuits,
an output of a flip-flop circuit in a previous stage is input to a flip-flop circuit of a next stage,
an output of a flip-flop circuit of a final stage is inverted and held by a flip-flop circuit of a first stage,
an output of one of the plurality of flip-flop circuits is output as a gray code corresponding to each bit,
a clock signal is commonly supplied to the zeroth bit gray code generation circuit and the plurality of gray code generation circuits, and
the zeroth bit gray code generation circuit outputs a signal at each decay of the clock signal and each of the plurality of gray code generation circuits outputs a signal at each rise of the clock signal, such that the signal output by the zeroth bit gray code generation circuit and the signal output by the plurality of gray code generation circuits shift from each other by half of a cycle of the clock signal.

4. A multi-bit gray code generation circuit comprising:
a zeroth bit gray code generation circuit configured to generate a gray code corresponding to a bit 0 of a multi-bit gray code; and a plurality of gray code generation circuits each configured to generate a gray code corresponding to each bit higher than the bit 0 of the multi-bit gray code,
wherein each of the plurality of gray code generation circuits comprises a plurality of flip-flop circuits,
an output of a flip-flop circuit in a previous stage is input to a flip-flop circuit of a next stage,
an output of a flip-flop circuit of a final stage is inverted and held by a flip-flop circuit of a first stage,
an output of one of the plurality of flip-flop circuits is output as a gray code corresponding to each bit, and
the zeroth bit gray code generation circuit includes only one flip-flop circuit configured to hold a value obtained by inverting an output in synchronization with a clock signal to output the output as the bit 0 of the gray code.

5. A multi-bit gray code generation circuit comprising:
a zeroth bit gray code generation circuit configured to generate a gray code corresponding to a bit 0 of a multi-bit gray code; and
a plurality of gray code generation circuits each configured to generate a gray code corresponding to each bit higher than the bit 0 of the multi-bit gray code,
wherein each of the plurality of gray code generation circuits comprises a plurality of flip-flop circuits,
an output of a flip-flop circuit in a previous stage is input to a flip-flop circuit of a next stage,
an output of a flip-flop circuit of a final stage is inverted and held by a flip-fop circuit of a first stage,
an output of one of the plurality of flip-flop circuits is output as a gray code corresponding to each bit,
the plurality of gray code generation circuits includes a first gray code generation circuit comprising
a second flip-flop circuit configured to hold a value obtained by inverting an input in synchronization with the dock signal to output the value and
a third flip-flop circuit configured to hold the value of the output of the second flip-flop circuit in synchronization with the clock signal to output the value to the second flip-flop circuit and to set the output to be a bit 1 of the gray code, and
the plurality of gray code generation circuits further includes a second gray code generation circuit comprising
a fourth flip-flop circuit configured to hold a value obtained by inverting input in synchronization with the clock signal to output the value,
a fifth flip-flop circuit configured to hold a value of an output of the fourth flip-flop circuit in synchronization with the clock signal to output the value,
a sixth flip-flop circuit configured to hold a value of an output of the fifth flip-flop circuit in synchronization with the clock signal to output the value and to set the output to be a bit 2 of the gray code, and
a seventh flip-flop circuit configured to hold a value of the output of the sixth flip-flop circuit in synchronization with the clock signal to output the value to the fourth flip-flop circuit.

6. The multi-bit gray code generation circuit according to claim 5,
wherein the plurality of gray code generation circuits further includes a third gray code generation circuit comprising
an eighth flip-flop circuit configured to hold a value obtained by inverting an input in synchronization with the clock signal to output the value,
a ninth flip-flop circuit configured to hold a value of an output of the eighth flip-flop circuit in synchronization with the clock signal to output the value,
a tenth flip-flop circuit configured to hold a value of an output of the ninth flip-flop circuit in synchronization with the clock signal to output the value,
an eleventh flip-flop circuit configured to hold a value of an output of the tenth flip-flop circuit in synchronization with the clock signal to output the value,
a twelfth flip-flop circuit configured to hold a value of an output of the eleventh flip-flop circuit in synchronization with the clock signal to output the value and to set the output to be a bit 3 of the gray code,
a thirteenth flip-flop circuit configured to hold a value of an output of the twelfth flip-flop circuit in synchronization with the clock signal to output the value,
a fourteenth flip-flop circuit configured to hold a value of an output of the thirteenth flip-flop circuit in synchronization with the clock signal to output the value, and
a fifteenth flip-flop circuit configured to hold a value of an output of the fourteenth flip-flop circuit in synchronization with the clock signal to output the value to the eighth flip-flop circuit.

7. The multi-bit gray code generation circuit according to claim 6,
wherein the multi-bit gray code generation circuit further includes
a fourth gray code generation circuit configured to generate a bit 4 of the gray code,
a first selection circuit configured to selectively output a value of the output from the third gray code generation circuit and a value obtained by inverting the output from the third gray code generation circuit, and
a second selection circuit configured to selectively output a value of the output from the fourth gray code generation circuit and a value obtained by inverting the output from the fourth gray code generation circuit.

8. The multi-bit gray code generation circuit according to claim 6,
wherein the multi-bit gray code generation circuit further includes
a fourth gray code generation circuit configured to generate a bit 4 of the gray code
a sixteenth flip-flop circuit configured to hold a value of an output of the first gray code generation circuit in synchronization with the clock signal to output the value,
a seventeenth flip-flop circuit configured to hold a value of an output of the seventh flip-flop circuit of the second gray code generation circuit in synchronization with the clock signal to output the value,
an eighteenth flip-flop circuit configured to hold a value of an output of the fifteenth flip-flop circuit of the third gray code generation circuit in synchronization with the clock signal to output the value,
a third selection circuit configured to selectively output the output from the zeroth bit gray code generation circuit and the clock signal,
a fourth selection circuit configured to selectively output the output from the first gray code generation circuit and the output from the zeroth bit gray code generation circuit,
a fifth selection circuit configured to selectively output the output from the second gray code generation circuit and the output from the sixteenth flip-flop circuit, a sixth selection circuit configured to selectively output the output from the third gray code generation circuit and the output from the seventeenth flip-flop circuit, and a seventh selection circuit configured to selectively output the output from the fourth gray code generation circuit and the output from the eighteenth flip-flop circuit.

9. A multi-bit gray code generation circuit comprising:

a zeroth bit gray code generation circuit configured to generate a gray code corresponding to a bit 0 of a multi-bit gray code; and a plurality of gray code generation circuits each configured to generate a gray code corresponding to each bit higher than the bit 0 of the multi-bit gray code, wherein each of the plurality of gray code generation circuits comprises a plurality of flip-flop circuits, an output of a flip-flop circuit in a previous stage is input to a flip-flop circuit of a next stage, an output of a flip-flop circuit of a final stage is inverted and held by a flip-flop circuit of a first stage, an output of one of the plurality of flip-flop circuits is output as a gray code corresponding to each bit, the multi-bit gray code generation circuit further includes a clock delay circuit configured to start outputting a clock signal after a predetermined number of clocks from reset releasing, and the clock signal delayed by the clock delay circuit is commonly supplied to the zeroth bit gray code generation circuit and the plurality of gray code generation circuits.

* * * * *